Aug. 17, 1971 TOMISABURO OKUMURA 3,600,235

METHOD FOR MANUFACTURING SEMICONDUCTOR DEVICE

Filed June 2, 1969 2 Sheets-Sheet 1

TOMISABURO OKUMURA
INVENTOR

BY Stevens, Davis, Miller & Mosher
ATTORNEYS

United States Patent Office 3,600,235
Patented Aug. 17, 1971

3,600,235
METHOD FOR MANUFACTURING SEMICONDUCTOR DEVICE

Tomisaburo Okumura, Kyoto, Japan, assignor to Matsushita Electronics Corporation, Osaka, Japan Filed June 2, 1969, Ser. No. 829,390
Claims priority, application Japan, June 5, 1968, 43/39,251
Int. Cl. H01l 7/34
U.S. Cl. 148—187 4 Claims

ABSTRACT OF THE DISCLOSURE

A manufacturing method of a semiconductor device having a source and drain doped opposite conduction type to the substrate and a gate on an insulator film coated on a surface portion of the semiconductor substrate between both doped regions; forming a doped layer preliminarily on the whole surface of substrate, etching these layers so as to form the source and drain regions, and forming a gate insulator film on the portions where the doped layers are removed by etching, thereby forming the gate electrode on these portions. By these steps a semiconductor device having a high mutual conductance and a low input electric capacitance can be obtained. This method is applicable to the manufacture of active elements such as transistors and further integrated circuit element.

This invention provides a method for manufacturing a highly efficient semiconductor device formed by metal-insulator-semiconductor. The main characteristics of a semiconductor device, e.g. an MOS transistor, obtained by the method of this invention are that the transistor has a short channel length and a small gate capacitance. The short channel length brings about a high mutual conductance while the small gate capacitance brings a small dielectric loss.

The method of this invention will be explained regarding to a field-effect transistor having two insulated gates with reference to the accompanying drawings, in which.

Figure 1:
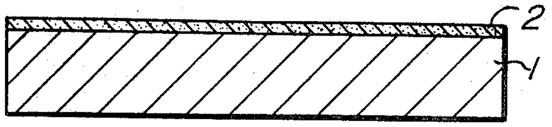
FIGS. 1 to 6 are explanatory views of the principle of the manufacturing method according to this invention.
Figure 2:
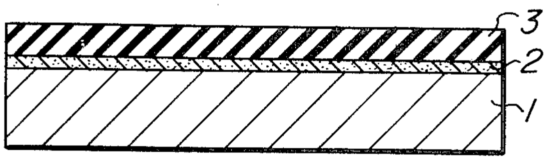
Figure 3:
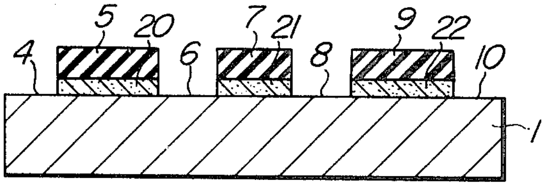
Figure 4:
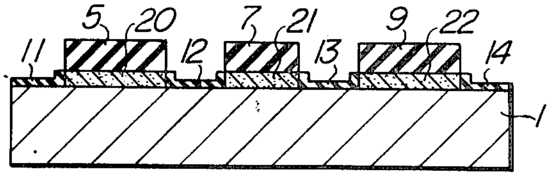
Figure 5:
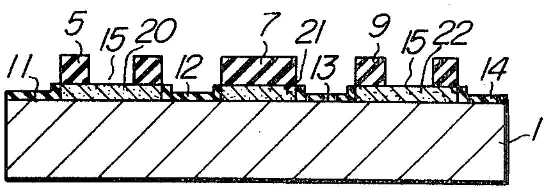
Figure 6:
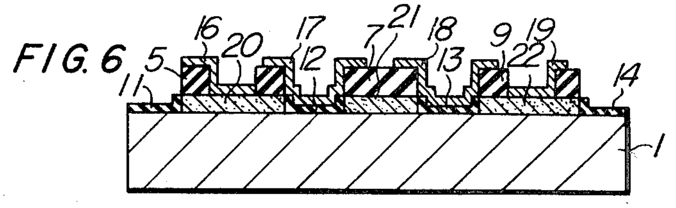

In FIG. 1, the substrate 1 is doped with impurity to make layer 2 having an opposite conductivity type to that of the substrate. If this doping is carried out by diffusion, the doped layer is formed on both surfaces of the substrate. The layer on the bottom side is usually removed in the later steps. Having no direct relation with the present invention, the bottom side layer is here omitted. In FIG. 2, a thick insulator layer 3 is formed on the doped layer 2. This insulator layer may be silicon oxide film formed by thermal oxidation of the silicon substrate, and is usually formed on both sides of the substrate. The bottom side layer being not important in the present invention is omitted in the figure. In FIG. 3, the doped layer 2 and the insulator layer 3 are partially removed by the photo-etching technique. 4, 6, 8 and 10 show the exposed surface portions of substrate 1 thereby formed. In FIG. 4, another insulator film thinner than the above insulator layer 3 is formed on the exposed portions 4, 6, 8 and 10, as denoted by 11, 12, 13 and 14. In FIG. 5, the parts 5 and 9 of the insulator layer 3 shown in FIG. 3 are removed thereby to expose the portions of the doped layer 20 and 22. In FIG. 6, a metal layer is deposited on the whole surface and thereafter the metal layer except the portions of the source electrode 16, the first gate electrode 17, the second gate electrode 18, and the drain electrode 19 is removed. The metal films 16 and 19 are contact with the source region 20 and the drain region 22 which are made of the impurity doped layer having the opposite conductivity type to that of the substrate. Next, although not shown, the chip shown in FIG. 6 is attached to the so-called header. The electrodes 16, 17, 18 and 19 are connected to the lead wires of the header by means of thin wires. The bottom surface of the substrate 1 directly bonded on the header and the source electrode 16 wire bonded to the header are led-out together. The header is capped for the purpose of air-tight sealing. Here the portion of the doped layer 21 which is formed simultaneously with the source and drain regions is left without any electric connection. The layer is called an island region.

The characteristics of this invention are as follows. The first gate electrode 17 near the source electrode 16 and the second gate electrode 18 near the drain electrode 19 cover completely the insulating films 12 and 13 between the source region 20 and the island region 21 and between the drain region 22 and the island region 21 respectively, and further extend over the thick insulating layers 5, 7 and 9 on the source, island and drain regions 20, 21 and 22. In other words the gate electrodes cover completely the conducting channels. Unless the oxide film on the channels is covered with the gate completely, the electric potential on these surface portions is not definite so that the drain current has uncertainty. It is necessary therefore that the channels are covered entirely with the gate electrodes. For this purpose the end portions of the each gate electrodes and the end portions of the source, island and drain regions are usually arranged to overlap. The overlapped portions are preferably as small as possible as they increase the electric capacitance of the gates.

In the semiconductor device obtained by this invention, the thick insulator film contributes little to the increase of the gate capacitance so that the size of the overlapped portions is allowed to be large. Even if the distances between the source and island regions and between the island and drain regions are made small, the width of the gate electrode can be made large. Thus, the superposition of the thin oxide film and the gate, i.e. the positioning of a mask for the etching of the metal layer in the photoresist step in FIG. 6 becomes more easy. It becomes possible to decrease the distances between the source and island regions and between the island and drain regions. Therefore, a small dielectric loss of gates due to the small gate capacitance and a large mutual conductance due to the small gate capacitance and attains small source-island and island-drain distance are obtained by this invention.

Figure 7:
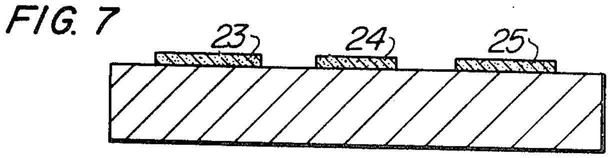
FIGS. 7 and 8 are explanatory views showing another method for obtaining the form shown in FIG. 3.
Figure 8:
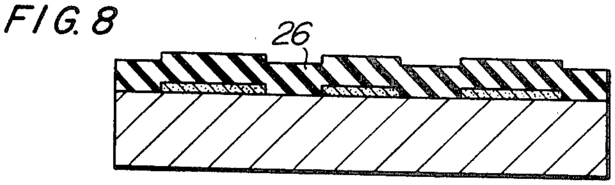

A partial modification of the above steps can also yield high performance transistors. The second method of this invention is to practice the steps as shown in FIGS. 7 and 8 after the step in FIG. 1 followed by the steps in FIGS. 3 to 6. After the formation of the doped layer 2 on the semiconductor substrate 1 the portion of the layer 2 except the source, island and drain portions 23, 24 and 25 are removed by etching as shown in FIG. 7. Next as shown in FIG. 8, an oxide film 26 is formed on the whole surface of substrate. The oxide film is photo-etched in accordance with a desired pattern, obtaining the form as shown in FIG. 3. Hereafter the same procedures as mentioned in the first method are performed.

Figure 9:
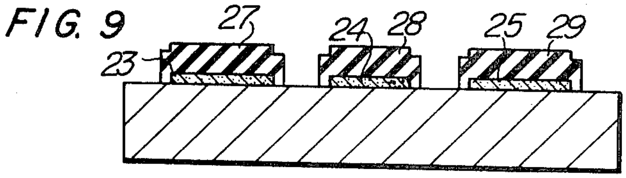
FIGS. 9 and 10 are views for explaining minute modifications of the form shown in FIG. 3.
Figure 10:
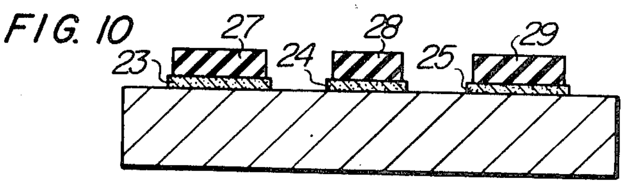

The second method needs photoresist treatments in the steps of FIGS. 7 and 3 and a mask alignment in the second photoresist step so that the work becomes rather more complicated than the first method, however, no side-etching of the oxide edge is appeared by the second method at step to make a form shown in FIG. 3 while the side etching is apt to appear at the silicon when the oxide film and the doped layer on the silicon substrate etching step followed the oxide etching step in the first method. Furthermore, by the second method it is possible to make the width of the oxide films 27, 28 and 29 a little larger or smaller than those of the impurity doped layers 23, 24 and 25 as shown in FIGS. 9 and 10 respectively.

The embodiments of this invention will be explained hereinafter.

(1) P type silicon with a specific resistivity of 3 Ωcm. used as the semiconductor substrate 1. Arsenic was diffused in the surface of the substrate thereby to form an n-type doped layer 2 (FIG. 1). The diffusion was done at 1200° C., then the diffusion depth 0.3$\mu$ and the surface impurity concentration $10^{20}$ atoms/cc. were obtained. Using wet oxygen gas, the surface of substrate was oxidized at 1200° C. thereby to form a thermal oxidized film 2 of 6000 A. thickness. By the photoetching technique the oxide film 3 and the n-type doped layer corresponding to the channels were removed to obtain the semiconductor substrate as shown in FIG. 3. The gaps 6 and 8 between the source and island regions and between the island and drain regions were 4$\mu$. Next in an oxygen atmosphere at 1100° C. an oxide film was grown 1000 A. thick on the exposed surface portions 4, 6, 8 and 10 (FIG. 4). After the steps of FIGS. 5 and 6 the substrate was bonded to a header. Bonding of thin wires and capping made a finished product. Heat treatments were done between the step of FIG. 4 and the step of FIG. 6 for improving the thermal stability of the MOS type field effect transistor, and in the step of FIG. 6 increasing the attachment strength of the metal film, i.e. aluminum in this embodiment. Although the diffusion depth of arsenic after the step of FIG. 1 was 0.3$\mu$, the final depth was controlled to be 1.5$\mu$ as a result of the heat processes successive to the above step. The dual gate MOS field-effect transistor thus obtained has a source peripheral length 5.3 mm., a capacitance of the first gate 9 pf., and a mutual conductance 15,000 $\mu\Omega$ at a drain current 8 ma.

(2) As another method sequential steps of FIGS. 1, 7, 8, 3, 4, 5 and 6 were practiced. Also in this case the semiconductor substrate was of p-type silicon with a specific resistivity of 3 Ωcm. By the same step as in embodiment 1 a diffusion layer was formed 0.3$\mu$ depth on the substrate. The gaps between the source region 23 and the island region 24 and between the island region 24 and the drain region 25 were 5.2$\mu$. Next in wet oxygen at 1200° C. an oxide film 26 of 6000 A. thickness was formed. After this oxidation step the photoresist technique was used for obtaining the form as shown in FIG. 3. The widths of the exposed portions 6 and 8 on the substrate were 4$\mu$, as designed by considering that the source island and drain regions expand in the thermal oxidation step. Hereafter the same steps were followed as in the embodiment 1. In this embodiment in order to obtain the form shown in FIG. 7 an additional photoetching process is necessary. Except for the mask used for this process the same masks were used as in embodiment 1. The characteristics of the dual gate MOS field-effect transistor thus obtained were substantially the same as that in the embodiment 1.

Although the explanation of this invention has been made of MOS field-effect transistors having dual insulated gates, there is no limitation on the number of gates as apparent from the above detailed description. This invention is applicable to the semiconductor devices with any number of insulated gates greater than two. Further, although the above explanation has been made of single active elements, this invention may be easily applied to an integrated circuit in which two or more of such active elements are integrated in a single substrate.

What is claimed is:

1. A method for manufacturing a semiconductor device having on a semiconuctor substrate doped regions of source and drain with the opposite conductivity type to that of said substrate and a gate electrode over the surface of an insulator film existing on the substrate between said source and drain regions comprising the steps of forming preliminarily a doped layer for the source and drain regions on the whole surface of said substrate; thereafter etching said doped layer to expose said substrate except the source and drain regions; and depositing an insulating film on said exposed surface.

2. A method for manufacturing a semiconductor device according to claim 1 comprising the steps of forming a doped layer for the source and drain regions on the whole surface of said substrate and a thick insulator film thereon; etching said doped layer and said insulator film thereby to expose said substrate except the portions of said source and drain regions; and depositing another insulator film on said exposed surface.

3. A method for manufacturing a semiconductor device according to claim 1 comprising the steps of forming a doped layer for the source and drain regions on the whole surface of said substrate; etching said doped layer thereby to expose said substrate except the portions of said source and drain regions; forming a thick insulating film on the hole surface of said semiconductor substrate; removing by etching the portion of said thick insulating film between the source and drain region to expose said substrate; and forming a thin insulating film on said exposed portion of said substrate.

4. A method for manufacturing a semiconductor device according to claim 1 having plural insulated-gate electrodes, forming a thick insulator film between said each electrode and forming an island region of the same substance as that of said source and drain regions under said thick insulating film between said each electrode.

References Cited

UNITED STATES PATENTS 3,386,163 6/1968 Brennemann et al. ---- 148—1.5

L. DEWAYNE RUTLEDGE, Primary Examiner

R. A. LESTER, Assistant Examiner

U.S. Cl. X.R.

29—571; 148—175, 188; 317—235